(12) United States Patent
Chang et al.

(10) Patent No.: US 6,498,070 B2
(45) Date of Patent: Dec. 24, 2002

(54) AIR GAP SEMICONDUCTOR STRUCTURE AND METHOD OF MANUFACTURE

(75) Inventors: Ting-Chang Chang, Hsinchu (TW); Yi-Shien Mor, Taipei (TW); Po-Tsun Liu, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/100,895

(22) Filed: Mar. 18, 2002

(65) Prior Publication Data

US 2002/0090794 A1 Jul. 11, 2002

Related U.S. Application Data

(62) Division of application No. 09/761,943, filed on Jan. 17, 2001.

(30) Foreign Application Priority Data

Jan. 9, 2001 (TW) ........................................ 90100427 A

(51) Int. Cl.[7] ............................................... H01L 21/76
(52) U.S. Cl. ...................... 438/421; 438/422; 438/619; 438/595; 438/409
(58) Field of Search ................................. 438/421, 422, 438/619, 595, 409

(56) References Cited

U.S. PATENT DOCUMENTS 6,329,279 B1 * 12/2001 Lee .............................. 438/619
6,194,748 B1 * 2/2002 Yu ............................... 257/216
6,358,842 B1 * 3/2002 Zhou et al. .................. 438/633

* cited by examiner

*Primary Examiner*—Long Pham
(74) *Attorney, Agent, or Firm*—J.C. Patents

(57) ABSTRACT

An air gap semiconductor structure and corresponding method of manufacture. The method includes forming a sacrificial polymer film over a substrate having metal lines thereon. A portion of the sacrificial polymer film is subsequently removed to form first spacers. A micro-porous structure layer is formed over the substrate and the metal lines and between the first spacers. A portion of the microporous structure layer is removed to form second spacers. The first spacers are removed by thermal dissociation to form air gaps. A dielectric layer is formed over the substrate and the metal lines and between the second spacers.

20 Claims, 2 Drawing Sheets

AIR GAP SEMICONDUCTOR STRUCTURE AND METHOD OF MANUFACTURE

CROSS-REFERENCE TO RELATED APPLICATION

This application is a divisional application of, and claims the priority benefit of, U.S. application Ser. No. 09/761,943 filed on Jan. 17, 2001.

BACKGROUND OF THE INVENTION

1. Field of Invention

The present invention relates to a metal-oxide-semiconductor structure and corresponding method of manufacture. More particularly, the present invention relates to an air gap semiconductor structure and corresponding method of manufacture.

2. Description of Related Art

Following the rapid reduction of semiconductor line width, the accompanied increase in resistor-capacitor (RC) time delay has greatly reduced the operating speed of integrated circuits. To reduce RC time delay, methods that can lower resistance is frequently adopted. The most common trend now is to replace conventional aluminum wires by copper wires.

A second way of reducing RC time delay is to reduce capacitance between conductive wires in a multi-layer design. Conventional silicon dioxide is no longer versatile enough for this purpose because silicon dioxide has a relatively high dielectric constant. In general, low dielectric constant organic or inorganic material is used to form inter-metal dielectric layer. However, a medium having the lowest dielectric constant is air (a dielectric constant of 1). Therefore, air is ideal dielectric medium for lowering the capacitance of a capacitor.

Although air is the best dielectric material for lowering capacitance, overall mechanical strength of the device is reduced correspondingly. A weakened structure can have serious effect in various aspects of subsequent integrated circuit fabrication.

A device having air as a dielectric medium generally has air gaps between metallic lines. Air gaps will destabilize the semiconductor device and lead to structural deformation. Moreover, the air gaps are normally distributed all over the substrate. Although capacitor has low capacitance when air is used as a dielectric medium layer, poor heat conductivity of air often leads to a rapid accumulation of heat and a rise in temperature during operation.

SUMMARY OF THE INVENTION

Accordingly, one object of the present invention is to provide an air gap semiconductor structure and corresponding method of manufacture. The method includes forming a sacrificial polymer film over a substrate having metal lines thereon. A portion of the sacrificial polymer film is subsequently removed to form first spacers. A micro-porous structure layer is formed over the substrate and the metal lines and between the first spacers. A portion of the micro-porous structure layer is removed to form second spacers. The first spacers are removed by thermal dissociation to form air gaps. Finally, a dielectric layer is formed over the substrate and the metal lines and between the second spacers.

In this invention, air gaps are only formed on the sidewalls of the metal lines. Other sections of the substrate are covered by conventional dielectric material. With this arrangement, not only can RC delay be lowered to increase operating speed of integrated circuits, mechanical strength of the integrated circuit can also be maintained.

In addition, the micro-porous structure layer increases the diffusion efficiency of by-products generated during the dissociation of the sacrificial polymer film, especially in the region between neighboring metal lines where height/separation ratio is high.

Furthermore, since only spacer-like air gaps are formed on the sidewalls of the metal lines, heat generated during device operation can easily be channeled away through surrounding conductive layer. Hence, heat dissipation problem can be ignored.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
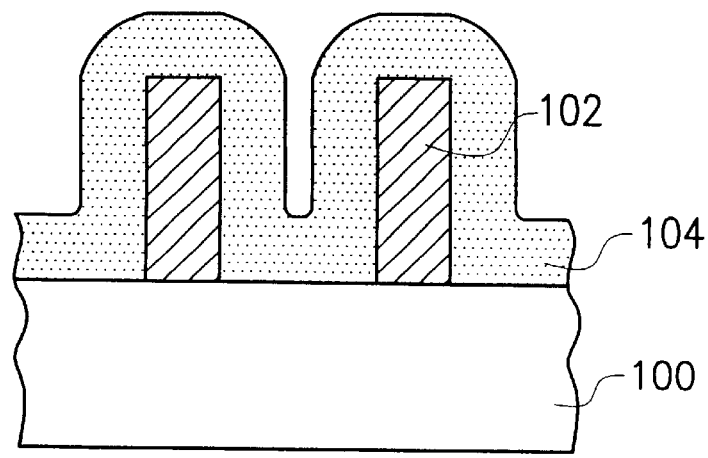
FIGS. 1 through 6 are schematic cross-sectional views showing the progression of steps for manufacturing an air gap semiconductor device according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1 through 6 are schematic cross-sectional views showing the progression of steps for manufacturing an air gap semiconductor device according to one preferred embodiment of this invention.

As shown in FIG. 1, a substrate 100 having metal lines 102 thereon is provided. The substrate 100 can be a semiconductor layer having multi-layered interconnects, for example. A sacrificial polymer film 104 is formed over the metal lines and the substrate 100. The sacrificial polymer film 104 is a low temperature dissociation polymer layer formed, for example, by spin-coating. The sacrificial film 104 can be a material layer having a dissociation temperature between 300° C. to 430° C., for example, polynorbornene.

Figure 2:
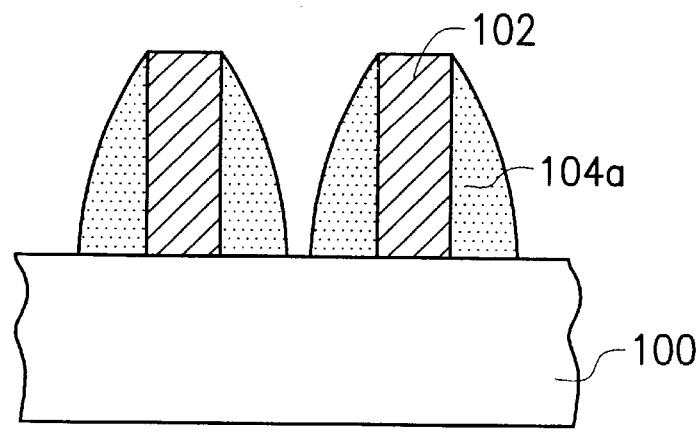

As shown in FIG. 2, a portion of the sacrificial film 104 is etched back to form first spacers 104a on the sidewalls of the metal lines 102.

Figure 3:
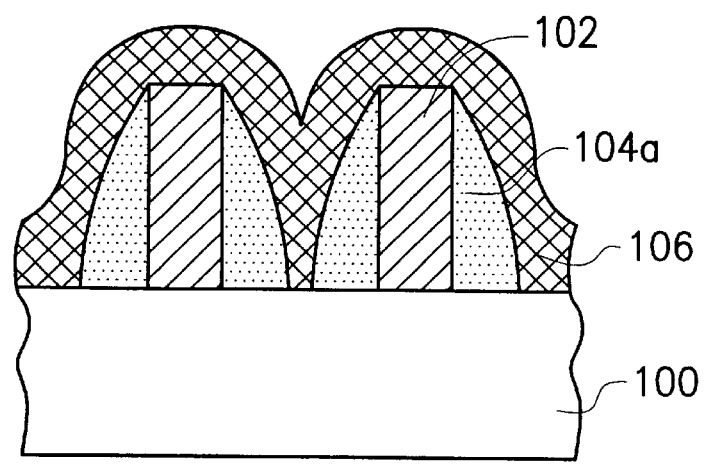

As shown in FIG. 3, a micro-porous structure layer 106 is formed over the substrate 100 and the metal lines 102 and between the spacers 104a. The micro-porous structure layer 106 can be formed, for example, by spin-coating. Materials that may form the micro-porous structure layer 106 include inorganic porous silicon dioxide and organic porous material, for example, Sol-gel, Xerogel, porous polyimide and porous metheyl silsesquioxane (MSQ).

Figure 4:
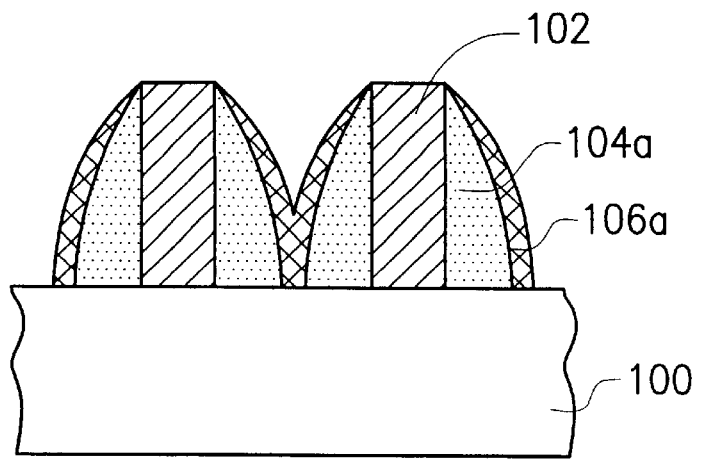

As shown in FIG. 4, a portion of the micro-porous structure layer 106 is removed by etching back to form second spacers 106a on the sidewalls of the first spacers 104a.

Figure 5:
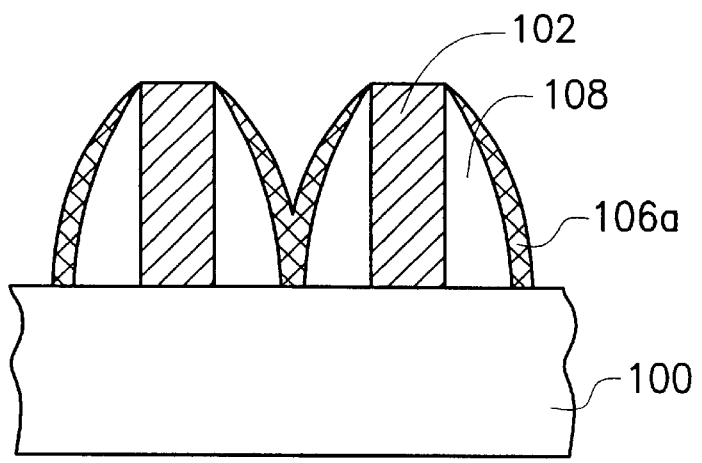

As shown in FIG. 5, the substrate 100 is put inside a furnace and heated to between about 400° C. to 450° C. The sacrificial spacers 104a dissociate into small molecular weight by-products (not shown). By diffusion, the by-products penetrate through the second spacers 106a into outer regions. Ultimately, the space originally occupied by the first spacers 104a is turned into air gaps 108.

Figure 6:
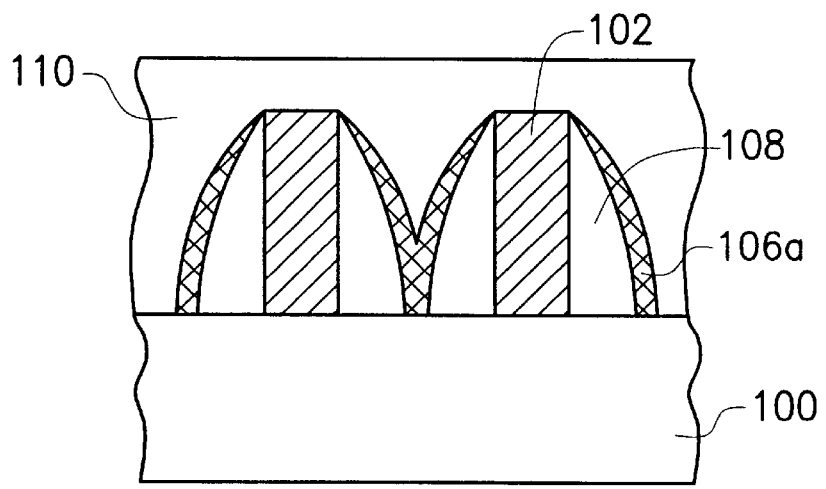

As shown in FIG. 6, a dielectric layer 110 is formed over the substrate 100 and the metal lines 102 and between the second spacers 106a. The dielectric layer 110 can be a silicon dioxide layer formed, for example, by plasma-enhanced chemical vapor deposition (PECVD) or spin-on-glass (SOG).

By forming porous second spacers 106a over the first spacers 104a before the dielectric layer 110, by-products of the dissociation can easily escape from the space originally occupied by the first spacers 104a. This is particularly important for diffusing by-products away from a region having a high aspect ratio such as the space between neighboring metal lines.

In summary, the advantages of the invention includes:
1. Air gaps are only formed on the sidewalls of the metal lines. Other sections of the substrate are covered by conventional dielectric material. With this arrangement, not only can RC delay be lowered to increase operating speed of integrated circuits, mechanical strength of the integrated circuit can also be maintained.
2. The micro-porous structure layer increases the diffusion efficiency of by-products generated during the dissociation of the sacrificial polymer film, especially in the region between neighboring metal lines where height/separation ratio is high.
3. Since only spacer-like air gaps are formed on the sidewalls of the metal lines, heat generated during device operation can easily be channeled away through surrounding conductive layer. Hence, heat dissipation problem can be ignored.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing an air gap semiconductor device, comprising the steps of:
   providing a substrate having a plurality of metal lines thereon;
   forming a sacrificial polymer film over the substrate and the metal lines by depositing a polymer compound that has a dissociation temperature between about 300° C. to 430° C.;
   removing a portion of the sacrificial polymer film to form first spacers respectively on sidewalls of the metal lines;
   forming a micro-porous structure layer over the substrate and the metal lines and between the first spacers;
   removing a portion of the micro-porous structure layer to form second spacers respectively on sidewalls of the first spacers;
   removing the first spacers; and
   forming a dielectric layer over the substrate and the metal lines and between the second spacers.

2. The method of claim 1, wherein the polymer compound includes polynorbornene.

3. The method of claim 1, wherein the step of forming the micro-porous structure layer includes depositing porous inorganic silicon dioxide.

4. The method of claim 1, wherein the step of forming the micro-porous structure layer includes depositing porous organic material.

5. The method of claim 4, wherein the porous organic material includes polyimide.

6. The method of claim 1, wherein the step of forming the sacrificial polymer film includes spin-coating.

7. The method of claim 1, wherein the step of removing a portion of the sacrificial layer includes etching.

8. The method of claim 1, wherein the step of forming the micro-porous structure layer includes spin-coating.

9. The method of claim 1, wherein the step of removing a portion of the micro-porous structure layer includes etching.

10. A method of manufacturing an air gap semiconductor device, comprising the steps of:
    providing a substrate having a plurality of metal lines thereon;
    forming a sacrificial polymer film over the substrate and the metal lines;
    removing a portion of the sacrificial polymer film to form first spacers respectively on sidewalls of the metal lines;
    forming a micro-porous structure layer over the substrate and the metal lines and between the first spacers;
    removing a portion of the micro-porous structure layer to form second spacers respectively on sidewalls of the first spacers;
    removing the first spacers by dissociating the first spacers into by-products by heating, and then removing the by-products through outward diffusion through the second spacers; and
    forming a dielectric layer over the substrate and the metal lines and between the second spacers.

11. A method of manufacturing an air gap semiconductor device, comprising the steps of:
    providing a substrate having a plurality of metal lines thereon;
    forming a sacrificial polymer film over the substrate and the metal lines;
    removing a portion of the sacrificial polymer film to form first spacers respectively on sidewalls of the metal lines;
    forming a micro-porous structure layer over the substrate and the metal lines and between the first spacers;
    removing a portion of the micro-porous structure layer to form a second spacers respectively on sidewalls of the first spacers;
    removing the first spacers by heating to a temperature between 400° C. to 450° C.; and
    forming a dielectric layer over the substrate and the metal lines and between the second spacers.

12. The method of claim 1, wherein the step of forming the dielectric layer includes depositing silicon dioxide.

13. The method of claim 10, wherein the polymer compound includes polynorbornene.

14. The method of claim 10, wherein the step of forming the micro-porous structure layer includes depositing porous inorganic silicon dioxide.

15. The method of claim 10, wherein the step of forming the micro-porous structure layer includes depositing porous organic material.

16. The method of claim 10, wherein the porous organic material includes polyimide.

17. The method of claim 10, wherein the step of forming the sacrificial polymer film includes spin-coating.

18. The method of claim 10, wherein the step of removing a portion of the sacrificial layer includes etching.

19. The method of claim 10, wherein the step of forming the micro-porous structure layer includes spin-coating.

20. The method of claim 10, wherein the step of removing a portion of the micro-porous structure layer includes etching.

* * * * *